United States Patent
MacDonald

(10) Patent No.: US 8,982,560 B2
(45) Date of Patent: Mar. 17, 2015

(54) THERMAL MANAGEMENT OF AN ELECTRONIC DEVICE

(71) Applicant: Mark MacDonald, Beaverton, OR (US)

(72) Inventor: Mark MacDonald, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 252 days.

(21) Appl. No.: 13/730,241

(22) Filed: Dec. 28, 2012

(65) Prior Publication Data

US 2014/0185241 A1    Jul. 3, 2014

(51) Int. Cl.
   *H05K 7/20*   (2006.01)
   *H05K 13/00*  (2006.01)
   *G06F 1/20*   (2006.01)

(52) U.S. Cl.
   CPC .............. *H05K 13/00* (2013.01); *G06F 1/203* (2013.01); *H05K 7/2029* (2013.01)
   USPC ............. 361/704; 351/679.48; 351/679.52; 351/679.54; 351/688; 351/700; 165/80.2; 165/80.3; 165/104.26; 165/104.33

(58) Field of Classification Search
   USPC .............. 361/679.46–679.55, 688–697, 361/700–714, 715, 719, 727; 165/80.2, 165/80.3, 80.4, 80.5, 104.14, 104.26, 165/104.33, 104.21; 62/3.7, 259.2; 29/592.1
   See application file for complete search history.

(56) References Cited

U.S. PATENT DOCUMENTS

| 5,313,362 | A | * | 5/1994 | Hatada et al. ................ 361/709 |
| 5,757,615 | A | * | 5/1998 | Donahoe et al. ......... 361/679.47 |
| 5,898,569 | A | * | 4/1999 | Bhatia ........................... 361/700 |
| 5,987,890 | A | * | 11/1999 | Chiu et al. ...................... 62/3.2 |
| 6,109,039 | A | * | 8/2000 | Hougham et al. .............. 62/3.7 |
| 6,621,702 | B2 | * | 9/2003 | Elias et al. .................... 361/700 |
| 7,068,508 | B2 | * | 6/2006 | Patel et al. .................... 361/699 |
| 7,375,967 | B2 | * | 5/2008 | Huang et al. ................. 361/707 |
| 7,764,501 | B2 | * | 7/2010 | Gu et al. ....................... 361/700 |
| 7,889,499 | B2 | * | 2/2011 | Lowell et al. ................ 361/689 |
| 2003/0142477 | A1 | * | 7/2003 | Elias et al. .................... 361/700 |
| 2004/0130870 | A1 | * | 7/2004 | Fleck et al. ................... 361/687 |

FOREIGN PATENT DOCUMENTS

JP     020071833746 A  *  7/2007  ................ G06F 1/20

* cited by examiner

*Primary Examiner* — Michail V Datskovskiy
(74) *Attorney, Agent, or Firm* — International IP Law Group, P.L.L.C.

(57) ABSTRACT

A system for thermal energy storage is disclosed herein. The system includes an electronic device and a docking station to receive the electronic device. The electronic device contains a device thermal-energy storage material to absorb thermal energy from the electronic device. The electronic device is to thermally couple to the docking station. The docking station contains a dock thermal-energy storage material. The state transition temperature of the dock thermal-energy storage material is lower than the state transition temperature of the device thermal-energy storage material such that thermal energy is transferred from the device thermal-energy storage material to the dock thermal-energy storage material.

32 Claims, 4 Drawing Sheets

300

400

THERMAL MANAGEMENT OF AN ELECTRONIC DEVICE

BACKGROUND

The present disclosure is generally related to a cooling system for electronic devices. For an electronic device, the amount of heat generated by device operation can be directly correlated with the device's computing capability. Thus, including heat dissipation devices in the electronic device can increase the device's computing capability. Some electronic devices use motorized fans to dissipate heat generating by device operation. However, motorized fans can be prone to mechanical failure, and cannot be used in smaller electronic devices such as cellular phones due to space constraints.

BRIEF DESCRIPTION OF THE FIGURES

The following detailed description may be better understood by referencing the accompanying drawings, which contain specific examples of numerous objects and features of the disclosed subject matter.

DETAILED DESCRIPTION

Embodiments described herein relate to an electronic device that provides cooling through a thermal energy storage material. A thermal energy storage material can be present in the electronic device to absorb the heat generated by device operation. However, one drawback of thermal energy storage is that the material's thermal energy storage capacity is constrained. Once that capacity is saturated, the thermal energy storage material no longer provides any cooling benefit. Furthermore, it may take long durations of low power to restore the material to its pre-saturation state and renew its functionality.

In some embodiments, the electronic device utilizes a thermal energy storage material to absorb the thermal energy generated by device operation. In some embodiments, the thermal energy storage material absorbs thermal energy by undergoing a state transition. Examples of state transitions can include solid-to-liquid melting (i.e., phase transition), hydration-dehydration, adsorption-desorption, and other high enthalpy reversible processes. The state transition can occur at the thermal energy storage material's state transition temperature, which can be a temperature range or a specific onset temperature, such as a phase transition temperature. The thermal energy storage material can store thermal energy as its state transition temperature is reached, and the thermal energy storage material undergoes a state change, for example, solid to liquid, among others. In embodiments disclosed herein, the thermal energy stored in the thermal energy storage material can be transferred to an external source, thus resetting the thermal energy storage material to its previous state and restoring its thermal energy storage capacity in a short period of time.

Figure 1:
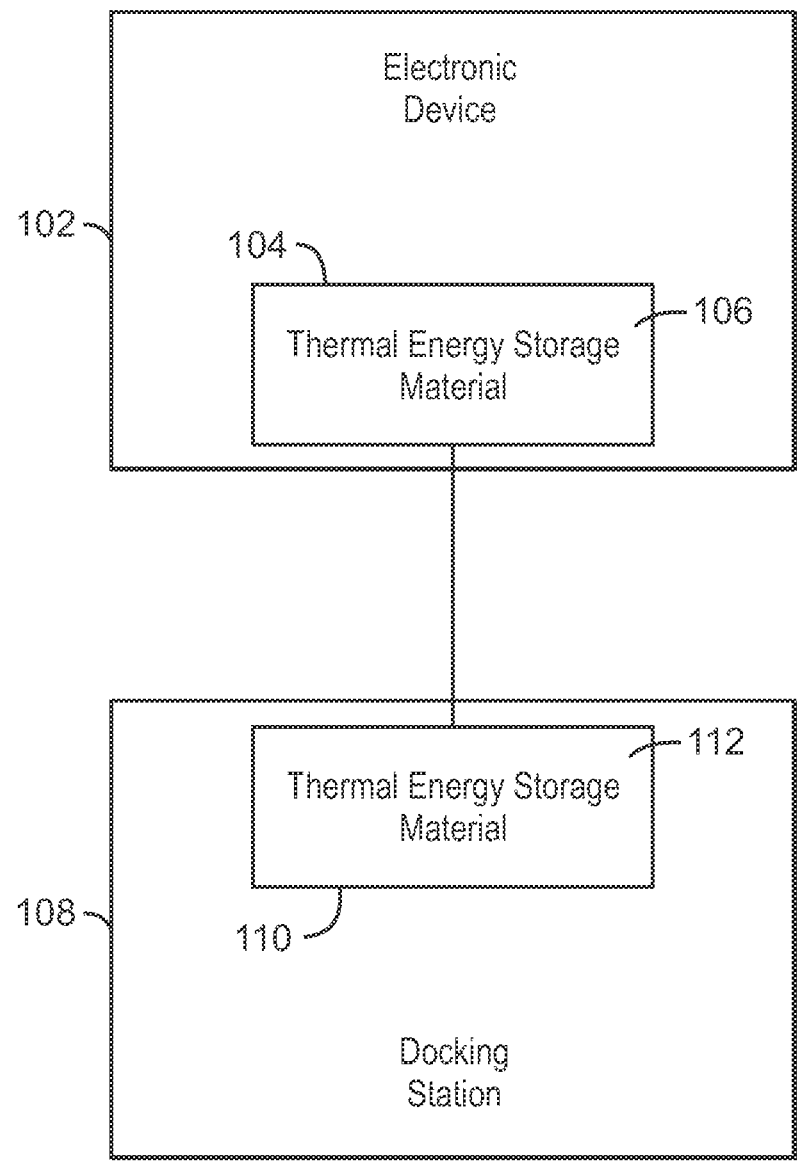
FIG. 1 is a block diagram of a system for restoring thermal energy storage capacity to an electronic device.

FIG. 1 is a block diagram of a system for restoring thermal energy storage capacity to an electronic device. The system 100 can include an electronic device 102 containing a device thermal-energy storage material enclosure 104 holding a thermal-energy storage material 106. In some embodiments, the electronic device 102 may be a portable electronic device that utilizes a battery, such as a laptop computer, a tablet computer, or a smartphone. The device thermal-energy storage material enclosure 104 can include, for example, a membrane or a metal canister configured to hold the thermal-energy storage material 106 in place when it is in a liquid phase.

The thermal-energy storage material 106 can be any suitable material with a state transition temperature high enough to absorb thermal energy from the electronic device 102, including paraffin waxes, hydrated salts, desiccant solutions or other evaporative systems, metal hydrates, low melting temperature metal alloys, certain fatty acids, and polyglycols, among others. Suitable waxes include octadecane, eicosane, docosane, and similar paraffins. For example, the state transition temperature can be approximately 40° C. In some embodiments, the total thermal energy capacity of the thermal-energy storage material 106 is correlated with the total energy storage of the battery of the electronic device 102, such that the thermal energy capacity of the thermal-energy storage material 106 is saturated at approximately the same time the energy level of the battery is depleted.

During device operation, the device thermal-energy storage material 106 can absorb and store thermal energy generated by the electronic device 102. The device thermal-energy storage material 106 can absorb the thermal energy while undergoing a state change, so that the temperature of the device thermal-energy storage material 106 does not substantially increase. In some embodiments, the device thermal-energy storage material 106 can transition from one state to another (for example, a solid phase to a liquid phase) while maintaining a temperature similar to the state transition temperature. The device thermal-energy storage material 106 can be considered saturated after nearly completely transitioning to the liquid phase.

The electronic device 102 can be thermally coupled to a docking station 108 that includes a dock thermal-energy storage material enclosure 110. The dock thermal-energy storage material enclosure 110 contains a dock thermal-energy storage material 112, for example, in either liquid or solid phase. The dock thermal-energy storage material 112 can have a state transition temperature lower than the state transition temperature of the device thermal-energy storage material 106. For example, if the device thermal-energy storage material 106 has a state transition temperature of 40° C., the dock thermal-energy storage material 112 can have a state transition temperature of approximately 30° C. Once the electronic device 102 and the docking station 108 are thermally coupled, the device thermal-energy storage material 106 enters a thermal recharge mode, wherein the thermal energy stored in the device thermal-energy storage material 106 will be transferred to the dock thermal-energy storage material 112. During the thermal recharge mode, the device thermal-energy storage material 106 can revert back to its previous phase, thus restoring its thermal-energy storage capacity. The rate at which the thermal energy is transferred can be controlled by the quality of the thermal connection as well as the difference in state transition temperatures between the device thermal-energy storage material 106 and the dock thermal-energy storage material 112.

Figure 2:
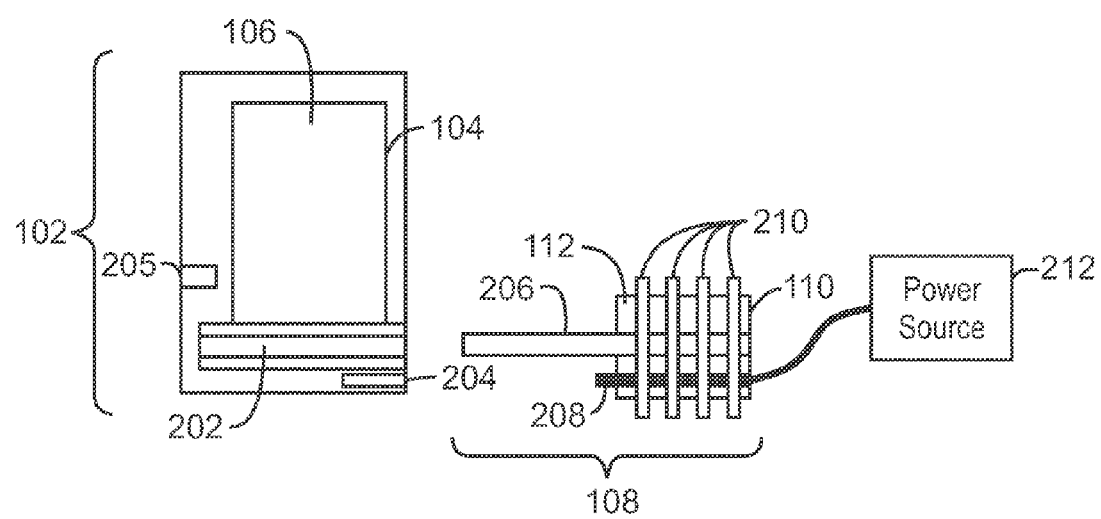
FIG. 2 is an illustration of a portable electronic device with thermal energy storage and its respective docking station, in accordance with embodiments.

FIG. 2 is an illustration of an electronic device with thermal energy storage and its respective docking station, in accordance with embodiments. Like numbered items are as described with respect to FIG. 1. In some embodiments, the electronic device 102 can be a portable device such as a laptop computer, a tablet computer, a cellular phone, or a mobile internet device. The electronic device 102 can include a device thermal-energy storage material 106 thermally coupled to various heat generating components within the electronic device, such as processors, memory devices, batteries, and the like. In this way, the device thermal-energy storage material 106 can store thermal energy generated during device operation. As noted herein, the device thermal-energy storage material 106 may be encased in a device thermal-energy storage material enclosure 104, such as a membrane, that contains the device thermal-energy storage material 106 in both solid and liquid phases.

The device thermal-energy storage material 106 may also be thermally coupled to a device thermal port 202 through which the device thermal-energy storage material 106 can be recharged. For example, the device thermal port 202 can be a recess configured to receive insertion of a plug on one side, wherein the opposing side of the device thermal port 202 is in direct contact with the device thermal-energy storage material 106. The electronic device 102 can also include any suitable number or type of additional ports, which may be configured to receive a connection from the docking station. For example, the electronic device 102 may include a device power port 204 configured to be electrically coupled to a power source. The electronic device 102 may also include one or more communication ports 205, to be communicatively coupled to other electronic devices. Furthermore, while only two additional ports 204 and 205 are shown, the electronic device 102 may include any suitable number of additional ports. In some embodiments, the ports 204 and 205 are configured to be coupled to corresponding ports of the docking station 108 upon insertion of the plug 206.

During device operation, the device thermal-energy storage material 106 may begin in a solid phase, and absorb thermal energy generated by the electrical device 102. The temperature of the device thermal-energy storage material 106 can increase as thermal energy is continued to be absorbed and stored, until the temperature reaches the state transition temperature of the device thermal-energy storage material 106. At the state transition temperature, the device thermal-energy storage material 106 can transition from a solid to a liquid as more thermal energy is transferred into the device thermal-energy storage material 106. In some embodiments, the device thermal-energy storage material 106 can completely transition into a liquid in approximately the same amount of time it takes the battery to be depleted of its electrical charge.

The docking station 108 can include the docking station thermal-energy storage material enclosure 110. The docking station 108 can also include a thermal dock port 206 configured to interact with the device thermal port 202 and a dock power port 208 configured to interact with the device power port 204. The dock thermal port 206 can be a plug made of any suitable thermally conductive material, such as metal, thermally conductive plastic, and the like. The dock thermal port 206 can be thermally coupled to the dock thermal-energy storage material 112. The state transition temperature of the dock thermal-energy storage material 112 can be lower than the state transition temperature of the device thermal-energy storage material 106. This helps to ensure that, during the recharge mode, a significant temperature differential will be maintained between the dock thermal-energy storage material 112 and the device thermal-energy storage material 106. The temperature differential between the two thermal-energy storage materials 106 and 112 facilitates faster heat transfer between the dock thermal-energy storage material 112 and the device thermal-energy storage material 106. The heat transfer may be implemented, for example, by a heat pipe contained within the dock thermal port 206.

In some embodiments, the dock thermal port 206 includes fins 210 thermally coupled to the dock thermal plug 206 to facilitate faster transfer of the thermal energy to external environment. The dock power port 208 may be electrically coupled to a power source 212 for charging a battery of the electronic device, for example. In some embodiments, the docking station 108 can include or be coupled to additional cooling components such as fans or thermoelectric coolers. In some embodiments, the dock thermal port 206 also includes a thermal plug that can be inserted into the device thermal port 202. In some embodiments, the dock power port 208 includes a power plug that can be inserted into the device power port 204.

Figure 3:
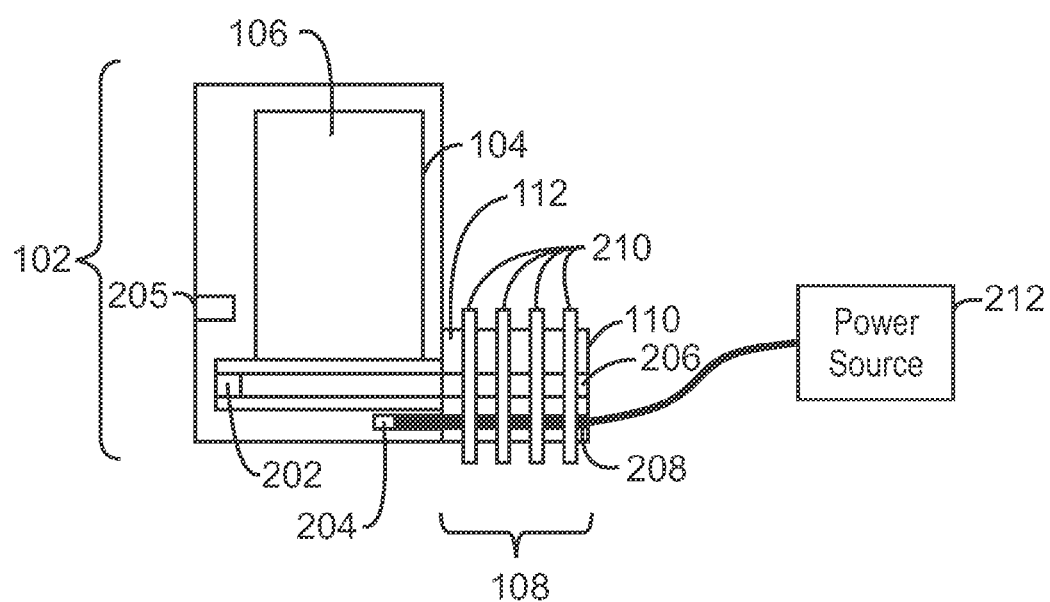
FIG. 3 is an illustration of the portable electronic device with its docking station plugged in, in accordance with embodiments.

FIG. 3 is an illustration of the electronic device with its docking station plugged in, in accordance with embodiments. Like numbered items are as described with respect to FIGS. 1 and 2. The electronic device 102 can be thermally coupled to the docking station 108 by establishing contact between the device thermal port 202 and the dock thermal port 206. In some embodiments, the electronic device 102 can be also electrically coupled to the docking station 108 by establishing contact between the device power port 204 and the dock power port 208.

Once the electronic device 102 and the docking station 108 are thermally coupled, the thermal-energy storage capacity of the electronic device 102 can be restored. For example, thermal energy from the device thermal-energy storage material 106, which may be in the liquid-phase, can flow to the dock thermal-energy storage material 112, which may be in the solid-phase, through the device thermal port 202 and the dock thermal port 206. The fins 210 can help increase the rate of thermal energy flow from the dock thermal port 206 to the dock thermal-energy storage material 112 contained in the dock thermal-energy storage material enclosure 110. During the thermal energy transfer, the device thermal-energy storage material 106 can transition back to a solid phase, while the dock thermal-energy storage material 112 can transition to a liquid phase. When the device thermal-energy storage material 106 has transitioned partially or completely to a solid phase, its thermal-energy storage capacity has been restored. At a state transition temperature, a thermal-energy storage material can absorb or release thermal energy without undergoing a substantial change in temperature. The electronic device 102 can also be de-coupled from the docking station before the device thermal-energy storage material 106 is fully recharged.

In some embodiments, the docking station 108 can recharge the battery of the electronic device 102 by transferring electrical charge from the power source 212 through the device power port 204. The battery can be recharged in approximately the same amount of time as it takes for the thermal-energy storage capacity of the electrical device 102 to be restored.

Figure 4:
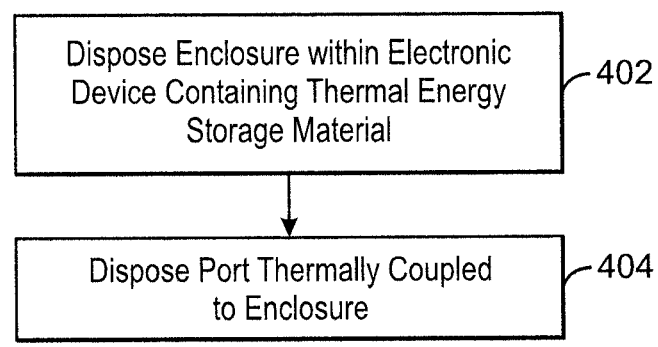
FIG. 4 is a process flow diagram of a method of manufacturing a system for restoring thermal energy storage capacity to an electronic device.

FIG. 4 is a process flow diagram of a method of manufacturing an electronic device. The method 400 may be used to manufacture the electronic device described above in relation to FIGS. 1-3.

At block 402, an enclosure is disposed within an electronic device containing a first thermal-energy storage material. The enclosure is thermally coupled to heat generating components of the electronic device, such as processors, memory devices, and the like. For example, the enclosure can be directly physically coupled to the heat generating components. In some embodiments, the enclosure is indirectly coupled to the heat generating components by any suitable heat transfer mechanism, including air flow conduits, heat pipes, and the like.

At block 404, a thermal port is disposed in the electronic device and thermally coupled to the enclosure. For example, the thermal port may be a recess within the enclosure. The thermal port is configured to be coupled to a thermal recharge element, of a docking station, for example. The thermal recharge can be thermally coupled to a second thermal-energy storage material disposed within the docking station. The thermal-energy storage material of the docking station can have a state transition temperature that is lower than the state transition temperature of the thermal energy storage material in the enclosure of the electronic device.

Although some embodiments have been described in reference to particular implementations, other implementations are possible according to some embodiments. Additionally, the arrangement and order of circuit elements or other features illustrated in the drawings or described herein need not be arranged in the particular way illustrated and described. Many other arrangements are possible according to some embodiments.

In each system shown in a figure, the elements in some cases may each have a same reference number or a different reference number to suggest that the elements represented could be different or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although flow diagrams and state diagrams may have been used herein to describe embodiments, the inventions are not limited to those diagrams or to corresponding descriptions herein. For example, flow need not move through each illustrated box or state or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. An electronic device, comprising
   a device thermal-energy storage material to absorb thermal energy from the electronic device; and
   a device thermal port thermally coupled to the device thermal-energy storage material, the device thermal port to couple to a docking station;
   wherein, when coupled to the docking station, thermal energy is transferred from the device thermal-energy storage material to a dock thermal-energy storage material in the docking station, the state transition temperature of the dock thermal-energy storage material being lower than the state transition temperature of the device thermal-energy storage material.

2. The electronic device of claim 1, comprising a device power port electrically coupled to a battery.

3. The electronic device of claim 2, wherein the battery can be recharged by transferring electrical charge to the battery from the docking station.

4. The electronic device of claim 3, wherein the amount of time needed to completely saturate the thermal-energy storage material with thermal energy is approximately equal to the amount of time needed to deplete the battery of electrical power.

5. The electronic device of claim 3, wherein the amount of time needed to completely transfer the thermal energy from the device thermal-energy storage material to the dock is approximately equal to the amount of time needed to completely recharge the battery.

6. The electronic device of claim 1, comprising a communication port to communicatively couple to a second electronic device.

7. The electronic device of claim 1, wherein the device thermal-energy storage material transitions from a solid phase to a liquid phase as thermal energy is absorbed into the device thermal-energy storage material at the state transition temperature.

8. The electronic device of claim 1, wherein the device thermal-energy storage material transitions from a liquid phase to a solid phase as thermal energy is transferred from the device thermal-energy storage material at the state transition temperature.

9. The electronic device of claim 1, wherein the device thermal-energy storage material is contained in an enclosure within the electronic device.

10. A docking station comprising:
    a dock thermal-energy storage material to absorb thermal energy from an electronic device; and
    a dock thermal port thermally coupled to the dock thermal-energy storage material;
    wherein thermal energy is transferred to the dock thermal-energy storage material from a device thermal-energy storage material in the electronic device, the state transition temperature of the device thermal-energy storage material being higher than the state transition temperature of the dock thermal-energy storage material.

11. The docking station of claim 10, the dock thermal port comprising a thermal plug to interact with a device thermal port on the electronic device.

12. The docking station of claim 10, comprising a dock power port electrically coupled to a power source.

13. The docking station of claim 12, the dock power port comprising a power plug to interact with a device power port on the electronic device.

14. The docking station of claim 13, wherein the power source can send electrical power to the electronic device.

15. The docking station of claim 10, wherein the thermal-energy storage material transitions from a solid phase to a liquid phase as thermal energy is transferred to the thermal-energy storage material at the state transition temperature.

16. The docking station of claim 10, comprising a fin thermally coupled to the dock thermal-energy storage material.

17. The docking station of claim 10, comprising a fan to circulate air over the dock thermal-energy storage material.

18. The docking station of claim 10, wherein the dock thermal-energy storage material is contained in an enclosure within the docking station.

19. A system comprising:
    an electronic device comprising a device thermal-energy storage material to conduct thermal energy from the electronic device, the electronic device to thermally couple to a docking station; and
    a docking station to receive the electronic device, the docking station comprising a dock thermal-energy storage material to conduct thermal energy from the device thermal-energy storage material, wherein the state transition temperature of the dock thermal-energy storage material is lower than the state transition temperature of the device thermal-energy storage material.

20. The system of claim 19, the electronic device comprising a thermal port to thermally couple to the dock thermal-energy storage material, wherein thermal energy is transferred through the thermal port.

21. The system of claim 19, the electronic device comprising a power port to electrically couple to a power source of the docking station.

22. The system of claim 21, wherein the amount of time to completely saturate the device thermal-energy storage material with thermal energy is approximately equal to the amount of time needed to deplete a battery of electrical power.

23. The system of claim 21, wherein the amount of time to completely transfer the thermal energy from the device thermal-energy storage material to the dock thermal-energy storage material is approximately equal to the amount of time needed to completely recharge a battery.

24. The system of claim 19, the electronic device comprising a communication port to communicatively couple to a second electronic device.

25. The system of claim 19, wherein the device thermal-energy storage material transitions from a solid phase to a liquid phase as thermal energy is absorbed into the device thermal-energy storage material.

26. The system of claim 19, wherein the device thermal-energy storage material transitions from a liquid phase to a solid phase as thermal energy is transferred from the device thermal-energy storage material.

27. The system of claim 19, wherein the dock thermal-energy storage material transitions from a solid phase to a liquid phase as thermal energy is transferred to the dock thermal-energy storage material.

28. The system of claim 19, wherein the device thermal-energy storage material is contained in an enclosure within the electronic device.

29. The system of claim 19, wherein the dock thermal-energy storage material is contained in an enclosure within the docking station.

30. A method of manufacturing an electronic device, comprising:
    disposing an enclosure within an electronic device, the enclosure thermally coupled to heat generating components of the electronic device and containing a first thermal-energy storage material with a first state transition temperature; and
    disposing a port thermally coupled to the enclosure, the port to couple to a thermal recharge element that is thermally coupled to a second thermal-energy storage material with a second state transition temperature;
    wherein the first state transition temperature is higher than the second state transition temperature.

31. The method of claim 30, comprising disposing an electrical port electrically coupled to the enclosure, the electrical port to couple to a battery that is electrically coupled to a power source.

32. The method of claim 30, comprising disposing a communication port communicatively coupled to the enclosure, the communication port to couple to another electronic device.

* * * * *